(12) United States Patent
Kawamura et al.

(10) Patent No.: US 7,541,642 B2
(45) Date of Patent: Jun. 2, 2009

(54) SEMICONDUCTOR DEVICE WITH A GATE ELECTRODE INCLUDING A PAIR OF POLYSILICON LAYERS

(75) Inventors: Keiko Kawamura, Yokohama (JP); Masanobu Tsuchitani, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 11/245,042

(22) Filed: Oct. 7, 2005

(65) Prior Publication Data
US 2007/0023828 A1  Feb. 1, 2007

(30) Foreign Application Priority Data
Jul. 26, 2005  (JP) ............... 2005-215671

(51) Int. Cl.
*H01L 29/78* (2006.01)
(52) U.S. Cl. ............ 257/331; 257/330; 257/332; 257/333; 257/334; 257/E29.201
(58) Field of Classification Search ......... 257/330–334, 257/E29.201, E29.26, E29.134, E29.257, 257/E29.262, 302; 438/270, 272
See application file for complete search history.

(56) References Cited

U.S. PATENT DOCUMENTS

| | | | |
|---|---|---|---|
| 6,323,090 B1 * | 11/2001 | Zommer | 438/270 |
| 6,979,865 B2 * | 12/2005 | Peake et al. | 257/341 |
| 7,045,858 B2 * | 5/2006 | Matsuda et al. | 257/330 |
| 2003/0146470 A1 * | 8/2003 | Hijzen et al. | 257/330 |
| 2005/0191810 A1 | 9/2005 | Matsuda et al. | |
| 2005/0199953 A1 | 9/2005 | Kawamura et al. | |
| 2006/0049453 A1 * | 3/2006 | Schmitz et al. | 257/330 |
| 2006/0151828 A1 * | 7/2006 | Takemori et al. | 257/327 |

FOREIGN PATENT DOCUMENTS
JP  11-163342  6/1999

* cited by examiner

*Primary Examiner*—Eugene Lee
(74) *Attorney, Agent, or Firm*—Oblon, Spivak, McClelland, Maier & Neustadt, P.C.

(57) ABSTRACT

A semiconductor device comprises a semiconductor substrate having a gate trench formed therein. A gate electrode is formed on a gate insulator in the gate trench. The gate electrode has ends close to the bottom of the gate trench, which are separated in a direction perpendicular to both sides of the gate trench, and portions except the separated ends, at least part of which is made higher in conductivity than other parts.

9 Claims, 13 Drawing Sheets

SEMICONDUCTOR DEVICE WITH A GATE ELECTRODE INCLUDING A PAIR OF POLYSILICON LAYERS

CROSS-REFERENCE TO RELATED APPLICATION

This application is based upon and claims the benefit of prior Japanese Patent Application No. 2005-215671, filed on Jul. 26, 2005, the entire contents of which are incorporated herein by reference.

BACKGROUND OF THE INVENTION

1. Field of the Invention

The present invention relates to a trench gate-structured semiconductor device, such as a power MOSFET and an IGBT, and method of manufacturing the same.

2. Description of the Related Art

A semiconductor device having a trench gate structure such as a power MOSFET and an IGBT is possible to ensure a channel width even in a small area. This is advantageous to provide a fine patterned element, thereby achieving a reduced on-resistance.

To provide the trench gate-structured MOSFET with an improved switching speed, reduction in switching loss is required as well as reduction in on-resistance. Switching loss-determining factors include a gate-drain capacitance (hereinafter also referred to as a gate-collector capacitance in the case of IGBT) and a gate-source capacitance (hereinafter also referred to as a gate-emitter capacitance in the case of IGBT). Among those, the gate-drain capacitance exerts a large influence on the switching loss. A part of the gate-drain capacitance is formed between a lower surface of a gate electrode and an n$^-$-type epitaxial layer opposing the lower surface, with a gate insulator interposed therebetween.

An increased thickness of the gate insulator on the bottom in a gate trench is effective to reduce the gate-drain capacitance (gate-collector capacitance). Such a semiconductor device has been known (JP-A 10-32331).

In the above-described prior art, ions of an n-type impurity are implanted into the bottom in the gate trench to form a high-concentration region in a semiconductor layer in the vicinity of the trench bottom. Thereafter, thermal oxidation is applied to form a thermal oxidized film on the trench bottom thicker than a thermal oxidized film on the side resulted from a difference in impurity concentration. In this case, the high-concentration region formed in the vicinity of the trench bottom causes a problem that a sufficient breakdown voltage of the element cannot be obtained.

SUMMARY OF THE INVENTION

According to an aspect of the present invention, there is provided a semiconductor device comprising a semiconductor substrate having a gate trench formed therein; a gate insulator formed along sides and the bottom of the gate trench in the semiconductor substrate; and a gate electrode formed on the gate insulator in the gate trench. The gate electrode has ends close to the bottom of the gate trench, which are separated in a direction perpendicular to both sides of the gate trench, and portions except the separated ends, at least part of which is made higher in conductivity than other parts.

According to another aspect of the present invention, there is provided a method of manufacturing a semiconductor device. The method comprises: forming a gate trench in a semiconductor substrate; forming a gate insulator along sides and the bottom of said gate trench; forming a polysilicon layer on said gate insulator in said gate trench such that said gate trench is not filled therewith completely; and forming a gate electrode having a pair of polysilicon layers and a gate metal layer by removing a portion from said formed polysilicon layer so as to leave said pair of polysilicon layers along both sides of said gate trench and burying said gate metal layer in between both sides of upper portions of said pair of polysilicon layers.

DETAILED DESCRIPTION OF THE INVENTION

Embodiments of the present invention will now be described with reference to the drawings.

First Embodiment

Figure 1:
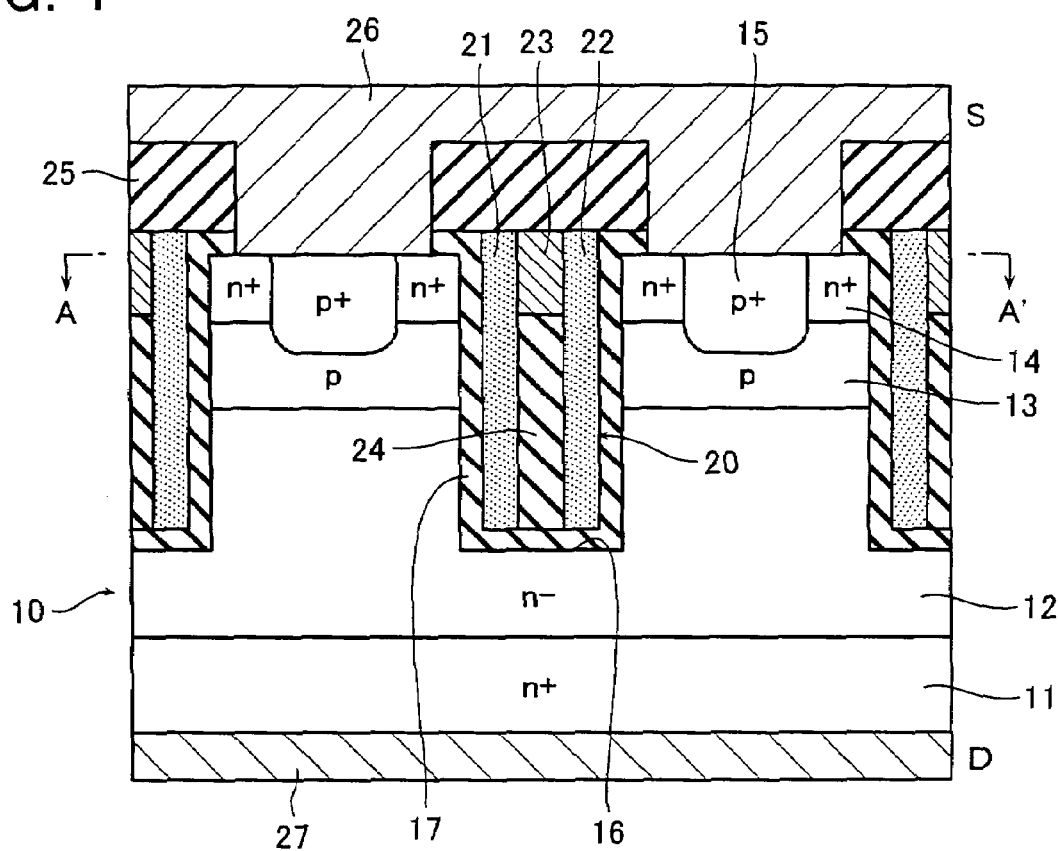
FIG. 1 is a cross-sectional view of a MOSFET according to a first embodiment of the present invention.

FIG. 1 is a cross-sectional view showing a brief structure of a power MOSFET according to a first embodiment of the present invention.

An $n^+$-type substrate 11 is provided to form an $n^-$-type epitaxial layer 12, a p-type base layer 13 and an $n^+$-type source layer 14 thereon in this turn. These configure a semiconductor substrate 10. Having a contact surface made coplanar with the $n^+$-type source layer 14, a $p^+$-type back gate layer 15 is formed selectively on the $n^+$-type source layer 14 so as to reach the p-type base layer 13.

A gate trench 16 is formed in the semiconductor substrate 10, extending from the $n^+$-type source layer 14 through the p-type base layer 13 to the $n^-$-type epitaxial layer 12. A gate electrode 20 is formed on a gate insulator 17 in the gate trench 16. The gate electrode 20 includes a pair of polysilicon layers 21, 22 formed along both sides of the gate trench 16 and a gate metal layer 23 buried in between sides of upper portions of the pair of polysilicon layers 21, 22. The gate metal layer 23 is composed of a conductor, such as aluminum, copper and tungsten, having a higher conductivity than that of the polysilicon layer 21, 22. The gate metal layer 23 extends along the gate trench 16 in a direction perpendicular to the page. Between sides of the polysilicon layers 21, 22 other than the upper portions, an intermediate insulator 24 is buried. Alternatively, a cavity may be formed in between the sides of the polysilicon layers 21, 22 other than the upper portions.

The gate electrode 20 is covered by an interlayer insulator 25. The interlayer insulator 25 has apertures formed facing the $n^+$-type source layer 14 and the $p^+$-type back gate layer 15. A source electrode 26 is formed on the interlayer insulator 25 to fill the apertures therewith. A drain electrode 27 is formed on a lower surface of the $n^+$-type substrate 11.

In the trench gate-structured MOSFET thus configured, when the source electrode 26 is grounded, a certain positive voltage is applied to the drain electrode 27. In this condition, a certain positive bias voltage is applied to the gate electrode 20 to form a channel in the p-type base layer 13 in the vicinity of the side of the gate trench 16. As a result, the MOSFET is turned on and current flows from the drain electrode 27 to the source electrode 26 via the semiconductor substrate 10. When the gate electrode 20 is grounded, the channel is eliminated and accordingly the MOSFET is turned off.

In the MOSFET of this embodiment, the gate electrode 20 has lower ends separated at both sides in a direction perpendicular to the side of the gate trench 16. Accordingly, it is possible to lower the gate-drain capacitance and reduce the switching loss. In addition, the gate metal layer 23 is buried in between both sides of the upper portions of the pair of polysilicon layers 21, 22 contained in the gate electrode 20. Accordingly, by the gate metal layer 23 it is possible to greatly reduce an elevation in gate resistance due to reduction in sectional area of the polysilicon layers 21, 22, resulting in a totally reduced gate resistance. The gate metal layer 23 is buried in between both sides of the polysilicon layers 21, 22 and does not project to the upper surface. This is advantageous to achieve planarization of the element.

A method of manufacturing the MOSFET according to the first embodiment is described next with reference to FIGS. 2-12.

Figure 2:
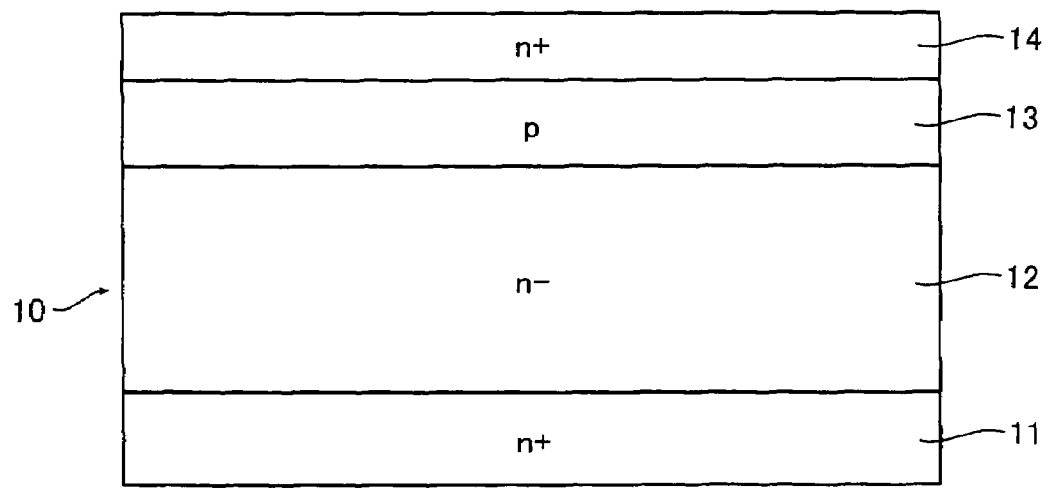
FIG. 2 is a cross-sectional view showing the MOSFET of FIG. 1 in order of process step.
Figure 3:
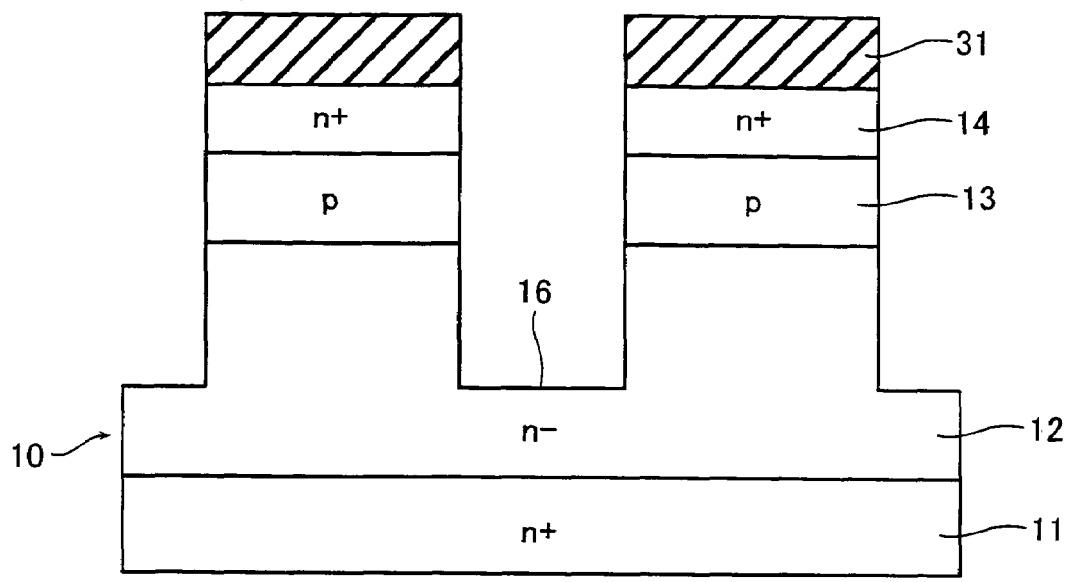
FIG. 3 is a cross-sectional view showing the MOSFET of FIG. 1 in order of process step.

First, the $n^-$-type epitaxial layer 12, the p-type base layer 13 and the $n^+$-type source layer 14 are formed on the $n^+$-type substrate 11 in this order, as shown in FIG. 2, through a process of epitaxial growth, ion implantation or diffusion to configure the semiconductor substrate 10. Then, an anisotropic etching is applied with a mask of a resist 31, as shown in FIG. 3, to form the gate trench 16 extending from the $n^+$-type source layer 14 through the p-type base layer 13 to the $n^-$-type epitaxial layer 12.

Figure 4:
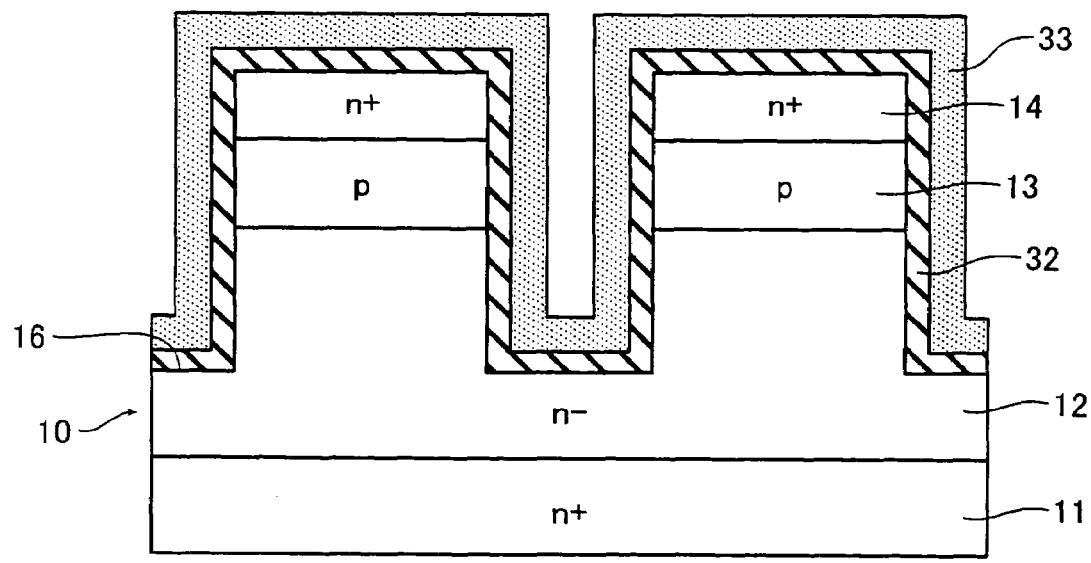
FIG. 4 is a cross-sectional view showing the MOSFET of FIG. 1 in order of process step.
Figure 5:
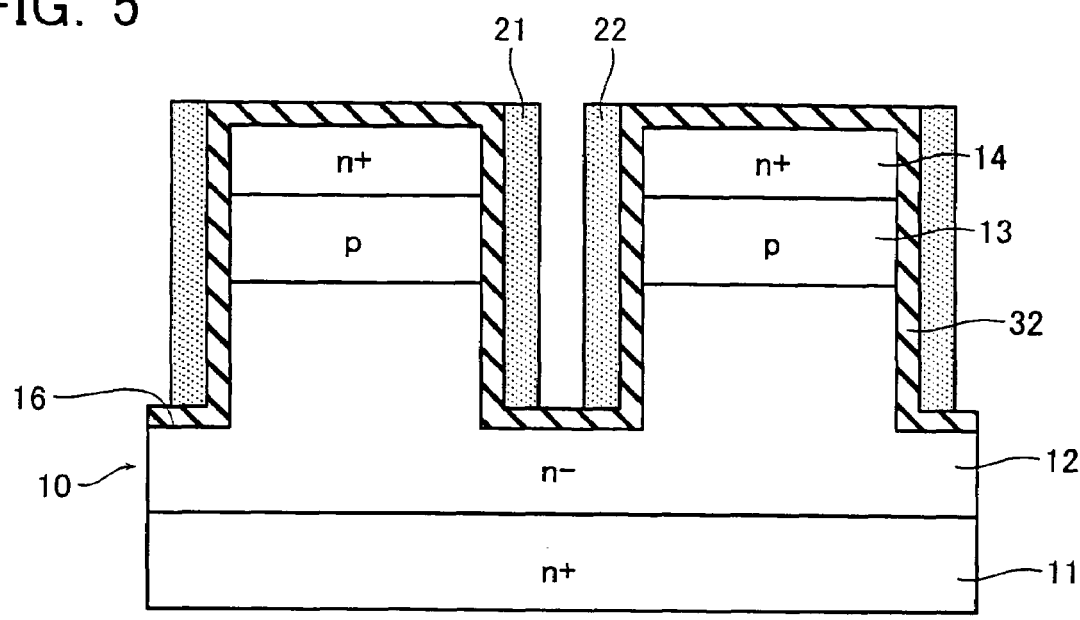
FIG. 5 is a cross-sectional view showing the MOSFET of FIG. 1 in order of process step.

Subsequently, after removal of the resist 31, as shown in FIG. 4, an oxide film 32 is formed to form the gate insulator 17 over the entire surface including the gate trench 16. Thereafter, prior to formation of the polysilicon layers 21, 22, a polysilicon layer 33 is formed on the oxide film 32 by CVD or the like such that the gate trench 16 is not filled therewith completely. Then, a reactive ion etching is employed to remove the polysilicon layer 33 from the upper surface of the semiconductor substrate 10 and the bottom of the gate trench 16 as shown in FIG. 5. As a result, the polysilicon layers 21, 22 are left on the portions along both sides of the gate trench 16.

Figure 6:
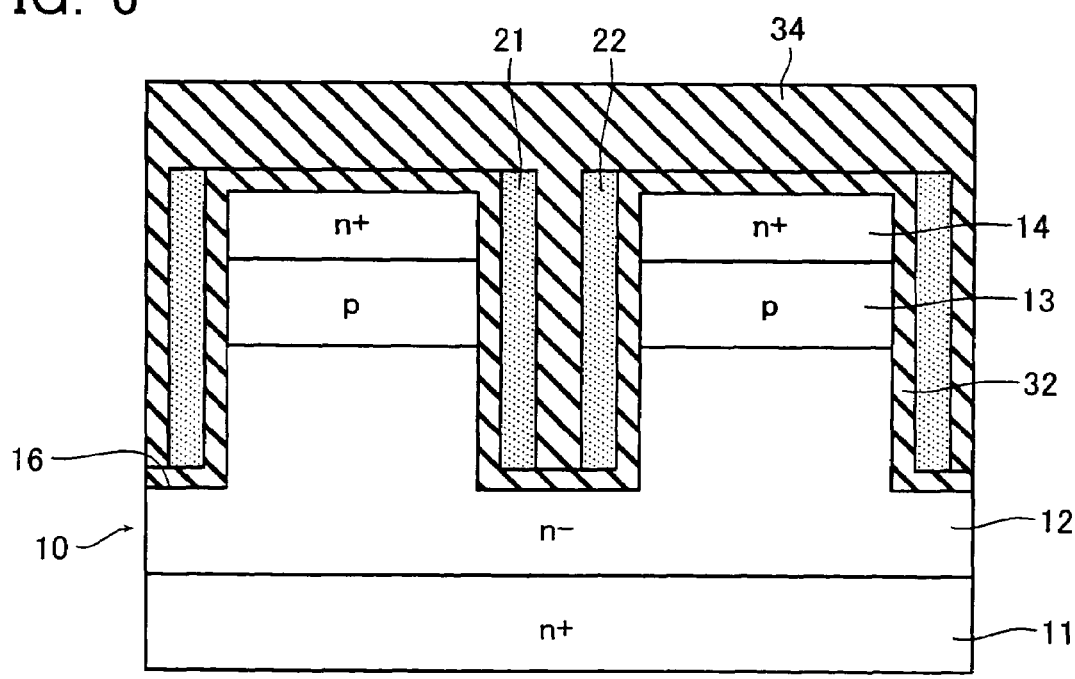
FIG. 6 is a cross-sectional view showing the MOSFET of FIG. 1 in order of process step.
Figure 7:
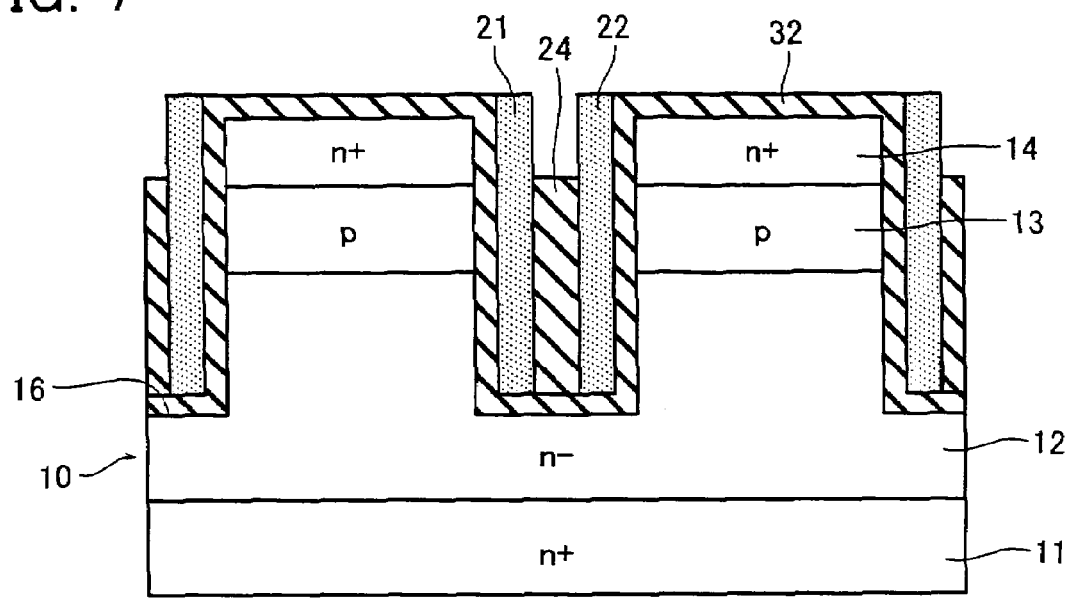
FIG. 7 is a cross-sectional view showing the MOSFET of FIG. 1 in order of process step.
Figure 8:
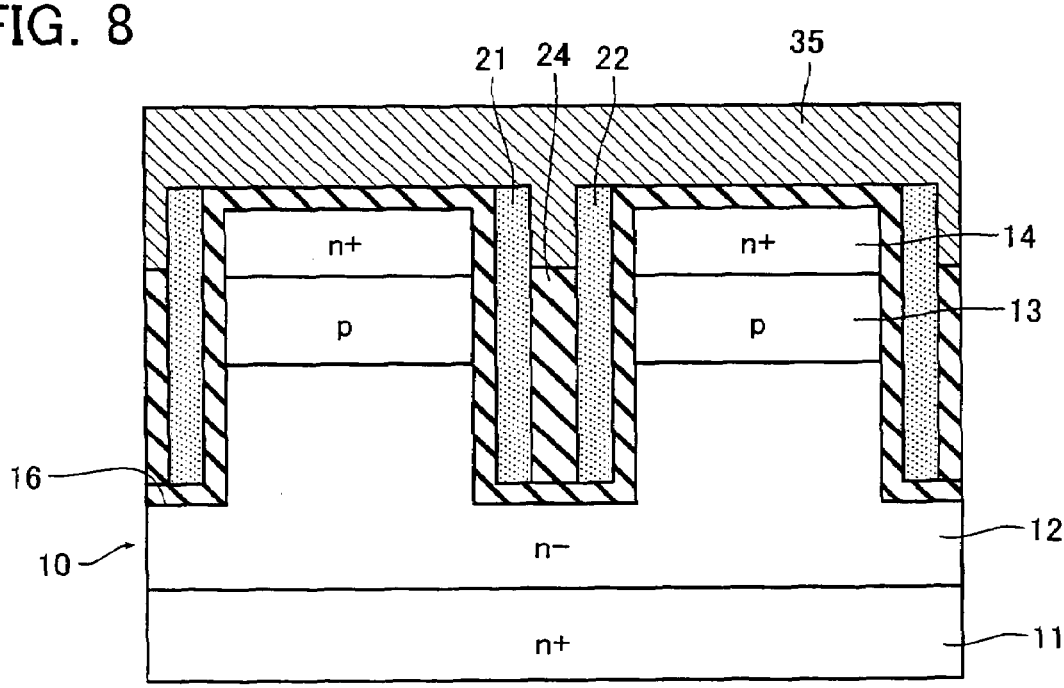
FIG. 8 is a cross-sectional view showing the MOSFET of FIG. 1 in order of process step.
Figure 9:
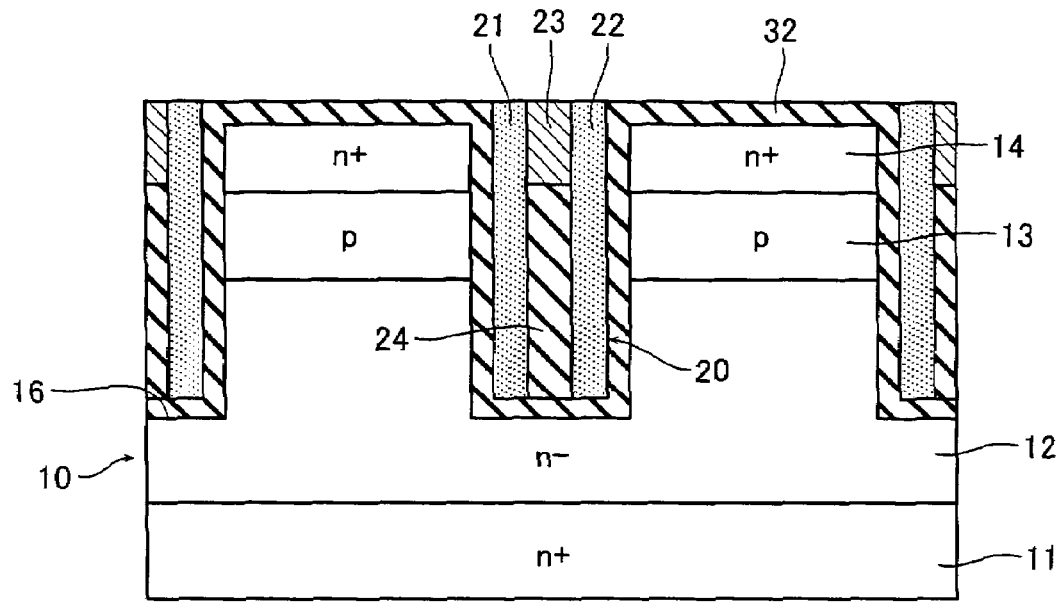
FIG. 9 is a cross-sectional view showing the MOSFET of FIG. 1 in order of process step.

Subsequently, an insulator 34 is buried in the gate trench 16 as shown in FIG. 6. The insulator 34 is then etched back, as shown in FIG. 7, until opposite sides of the upper portions of the polysilicon layers 21, 22 are exposed and a certain-depth groove is formed. As a result, the intermediate insulator 24 is formed between the polysilicon layers 21, 22. Thereafter, a metal layer 35 is formed as shown in FIG. 8. Then, the upper portion of the metal layer 35 is removed by etch back or CMP (Chemical Mechanical Polishing), as shown in FIG. 9, to bury the gate metal layer 23 in between the sides of the upper portions of the polysilicon layers 21, 22.

Figure 10:
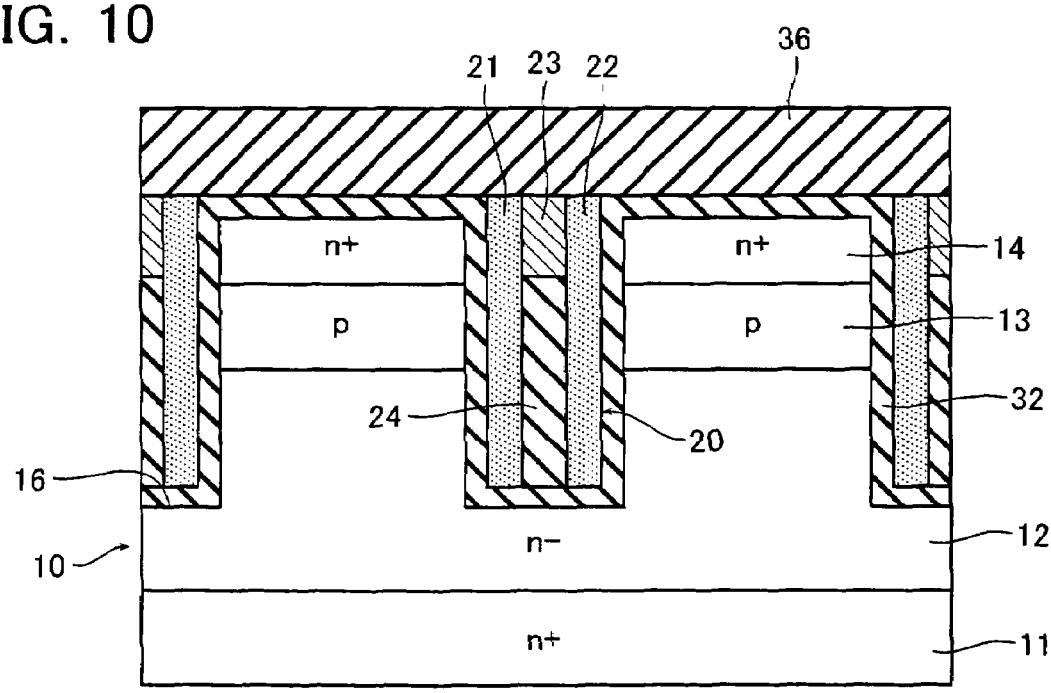
FIG. 10 is a cross-sectional view showing the MOSFET of FIG. 1 in order of process step.
Figure 11:
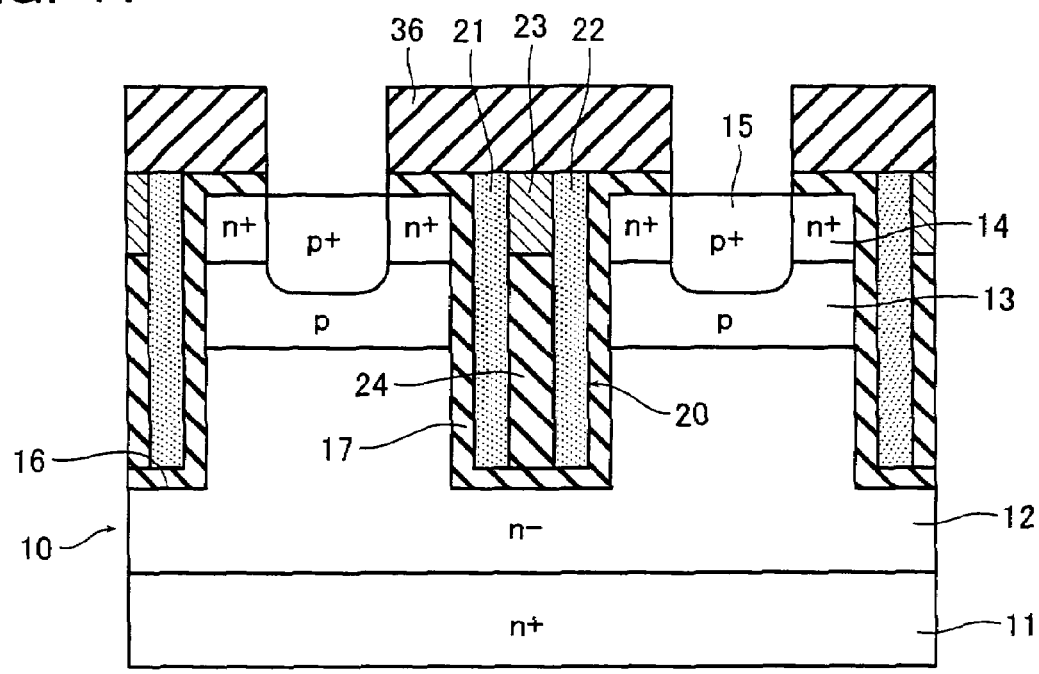
FIG. 11 is a cross-sectional view showing the MOSFET of FIG. 1 in order of process step.
Figure 12:
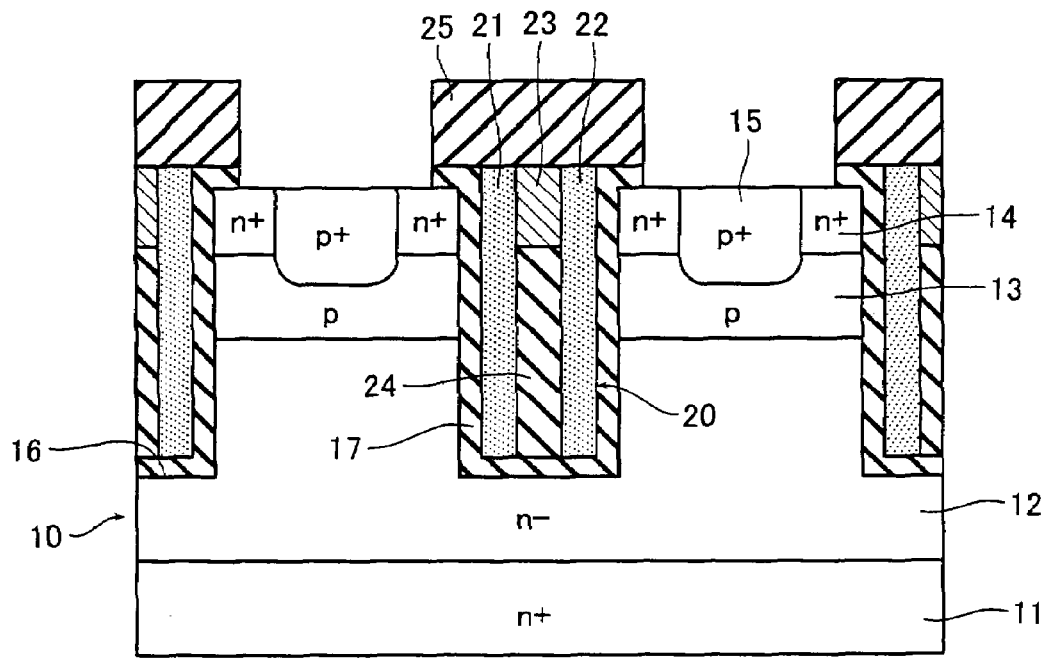
FIG. 12 is a cross-sectional view showing the MOSFET of FIG. 1 in order of process step.

Further, an oxide film 36 is formed on the upper surface of the semiconductor substrate 10 as shown in FIG. 10 and etching is applied to form the aperture facing the $n^+$-type source layer 14 as shown in FIG. 11. Then, a p-type impurity is diffused with a mask of the oxide film 36 to form the $p^+$-type back gate layer 15. In addition, the peripheral portion around the aperture in the oxide film 36 is removed by etching to enlarge the aperture, resulting in the interlayer insulator 25 as shown in FIG. 12. Thereafter, the source electrode 26 and the drain electrode 27 as shown in FIG. 1 and a gate electrode pad, not shown, are formed to complete the MOSFET of this embodiment.

In this embodiment, the gate metal layer 23 is buried in between both sides of the upper portions of the polysilicon layers 21, 22 to ensure the planarity of the element surface.

Second Embodiment

Figure 13:
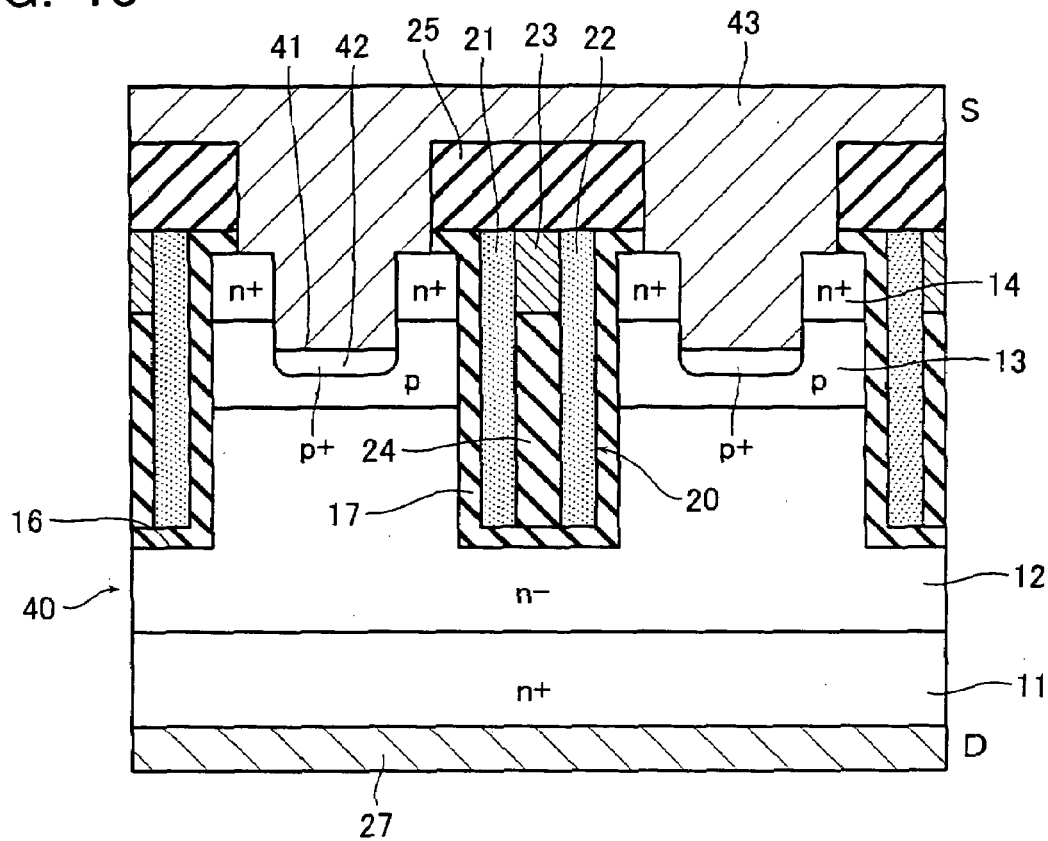
FIG. 13 is a cross-sectional view of a MOSFET according to a second embodiment of the present invention.

FIG. 13 is a cross-sectional view showing a structure of a MOSFET according to a second embodiment of the present invention. In this embodiment, a trench contact structure is employed in a source contact and a back gate contact.

A semiconductor substrate 40 is provided to form a contact trench 41 extending from the $n^+$-type source layer 14 to the p-type base layer 13. A $p^+$-type back gate layer 42 is formed by diffusion in the p-type base layer 13 on the bottom of the contact trench 41. A source electrode 43 is buried in the contact trench 41 and brought into contact with the $n^+$-type source layer 14 and the $p^+$-type back gate layer 42.

In this embodiment, the source electrode 43 is connected at the side of the contact portion to the $n^+$-type source layer 14 and connected at the bottom of the contact portion to the $p^+$-type back gate layer 42. This is effective to enhance the breakdown voltage of the source electrode 43 sufficiently.

This embodiment is directed to the MOSFET though such the contact trench type may be applied to an IGBT. In this case, residual holes, which are not recombined at the time of turn-off but left in the $n^-$-type epitaxial layer 12, can evacuate to the emitter efficiently. This is effective to prevent tail current from arising at the time of turn-off.

Figure 14:
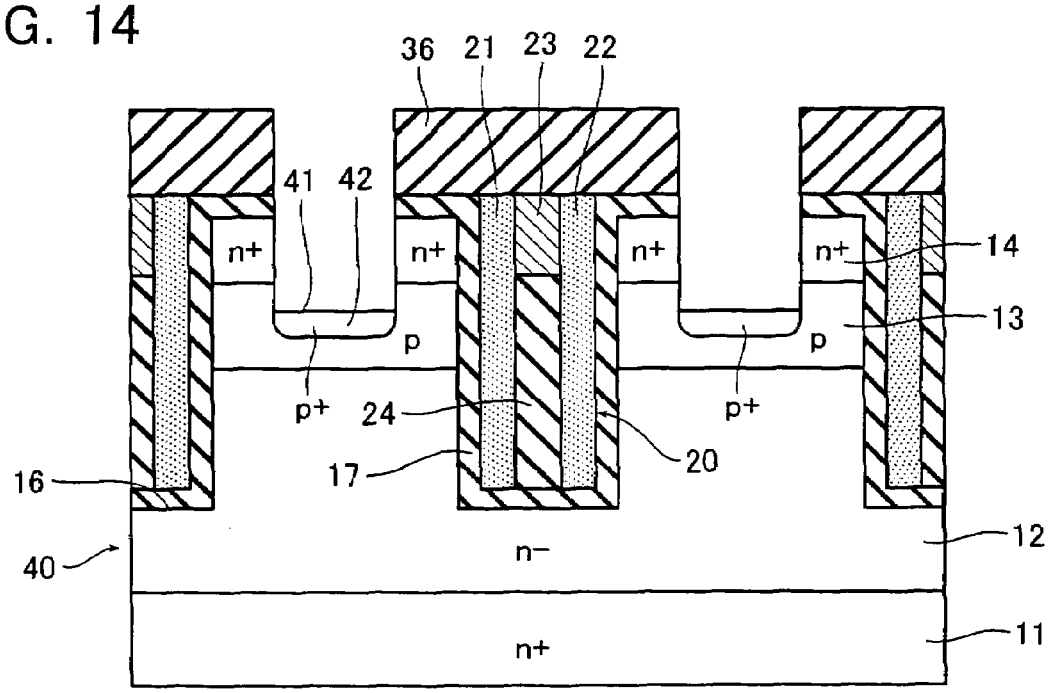
FIG. 14 is a cross-sectional view showing the MOSFET of FIG. 13 in order of process step.

In the first embodiment the oxide film 36 of FIG. 10 is etched to form the aperture facing the n⁺-type source layer 14 and the oxide film 36 is employed as the mask to diffuse the p-type impurity as shown in FIG. 11. Instead, the MOSFET of this embodiment can be produced by forming the contact trench 41 through the etching with the mask of the oxide film 36 and forming the p⁺-type back gate layer 42 on the bottom of the contact trench 41 as shown in FIG. 14. Other process steps are almost similar to those in the preceding embodiment.

Third Embodiment

Figure 15:
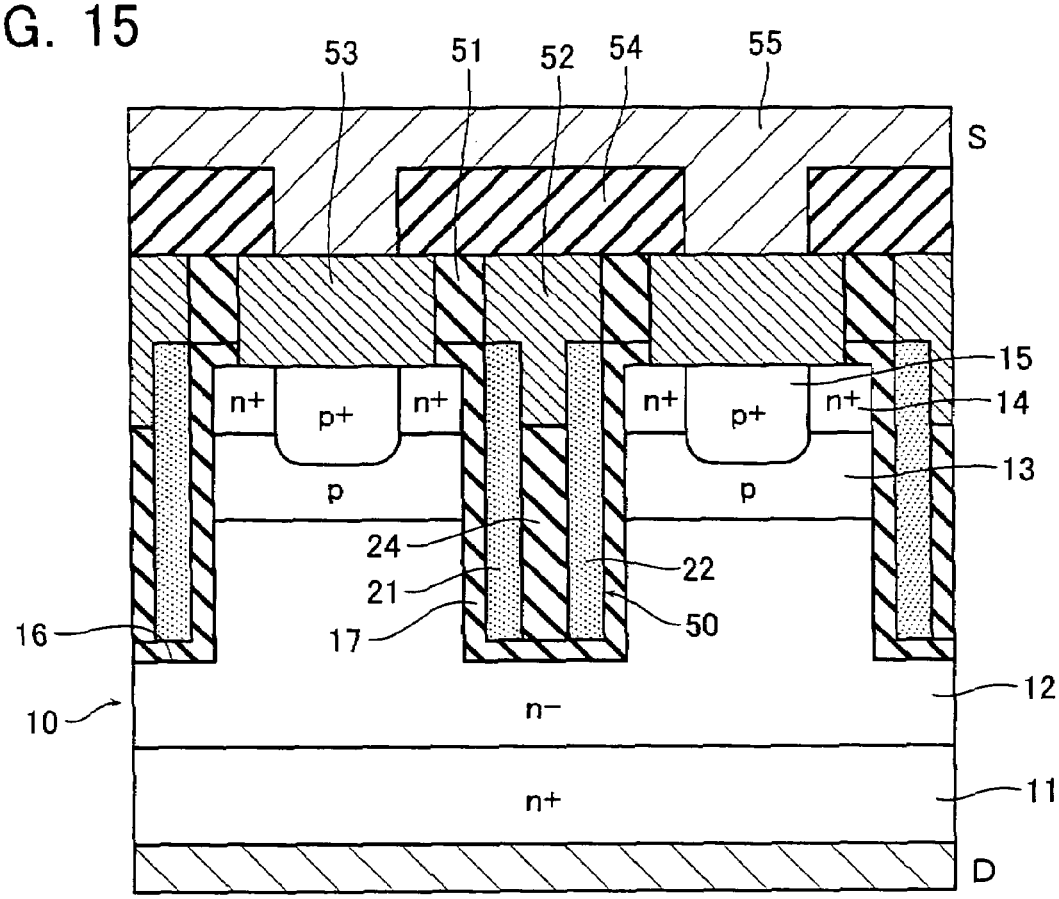
FIG. 15 is a cross-sectional view of a MOSFET according to a third embodiment of the present invention.

FIG. 15 is a cross-sectional view of a MOSFET according to a third embodiment of the present invention.

This embodiment includes a source contact metal layer 53 in addition to the first embodiment to arrange a gate metal layer 52 and the source contact metal layer 53 in the same layer for planarization to reduce roughness on a wire layer above the metal layers.

A metal isolation layer 51 is formed on the semiconductor substrate 10 to isolate an upper space above the polysilicon layers 21, 22 from an upper space above the contact surface of the n⁺-type source layer 14 and the p⁺-type back gate layer 15. The gate metal layer 52 is formed in the upper space at the gate and the source contact metal layer 53 in the upper space at the source contact surface in the same process step such that they are isolated by the metal isolation layer 51 from each other. Therefore, the metal isolation layer 51, the gate metal layer 52 and the source contact metal layer 53 have upper surfaces formed in almost the same plane. An interlayer insulator 54 is formed on a gate electrode 50. A source electrode 55 is formed on the interlayer insulator 54 and connected to the source contact metal layer 53.

A method of manufacturing the MOSFET according to this embodiment is described next.

Figure 16:
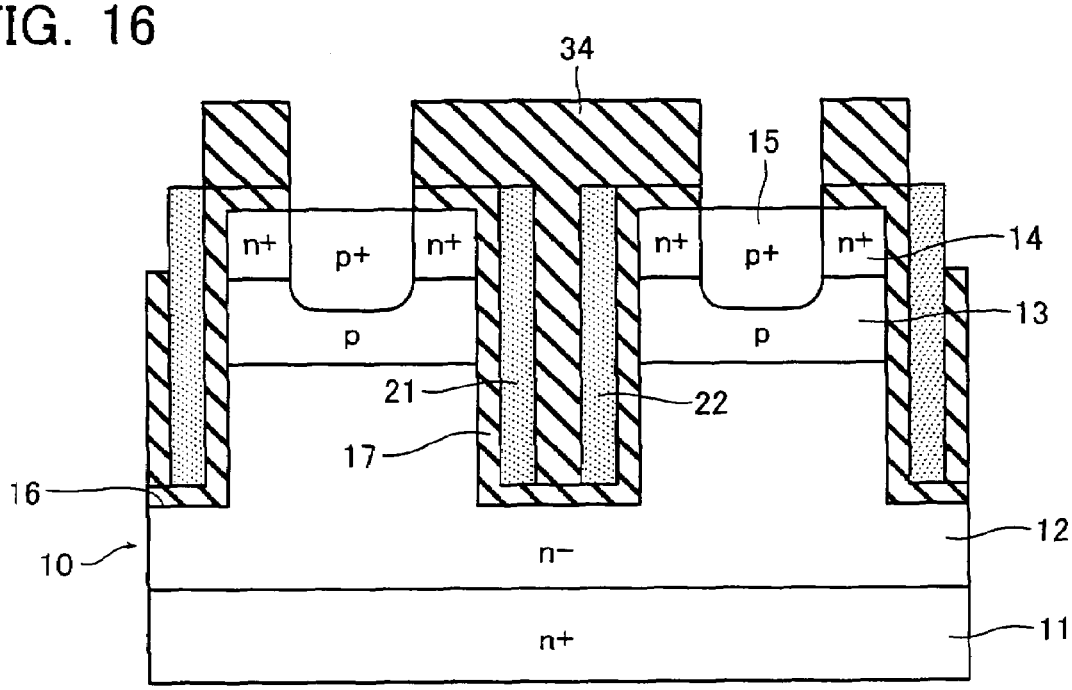
FIG. 16 is a cross-sectional view showing the MOSFET of FIG. 15 in order of process step.
Figure 17:
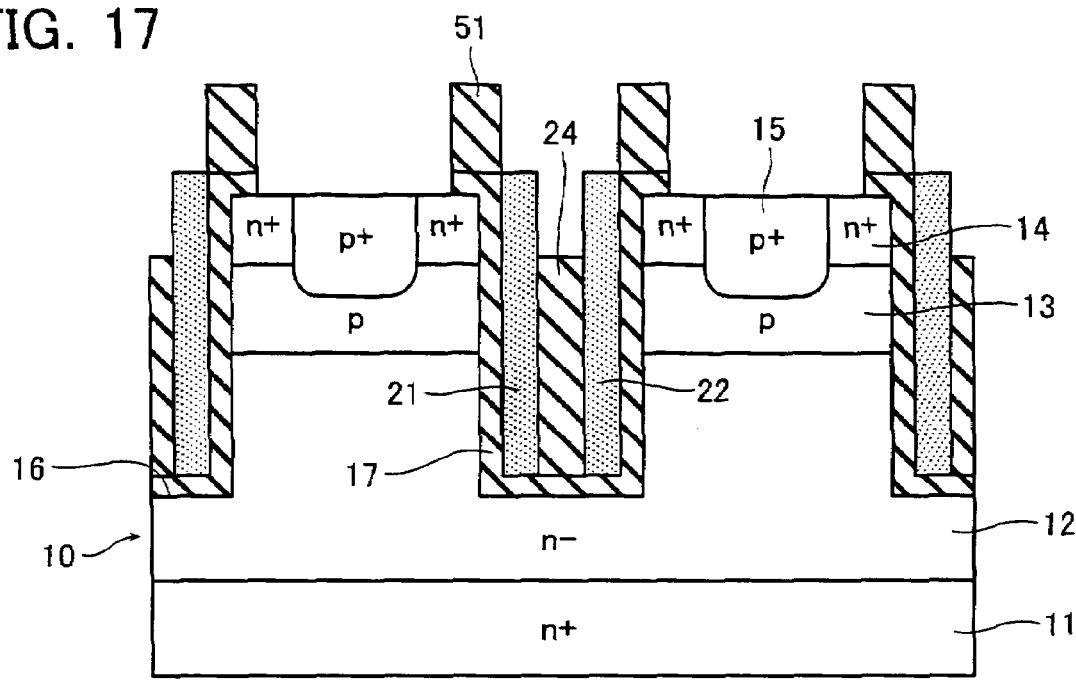
FIG. 17 is a cross-sectional view showing the MOSFET of FIG. 15 in order of process step.

Without etching back the insulator 34 shown in FIG. 6 of the first embodiment, only the aperture is formed for use in formation of the p⁺-type back gate layer 15 as shown in FIG. 16. After the p⁺-type back gate layer 15 is formed, a selective etching is applied to enlarge the aperture at the p⁺-type back gate layer 15 and expose the upper portions of the polysilicon layers 21, 22 as shown in FIG. 17. Thus, residual part of the insulator 34 turns into the metal isolation layer 51.

Figure 18:
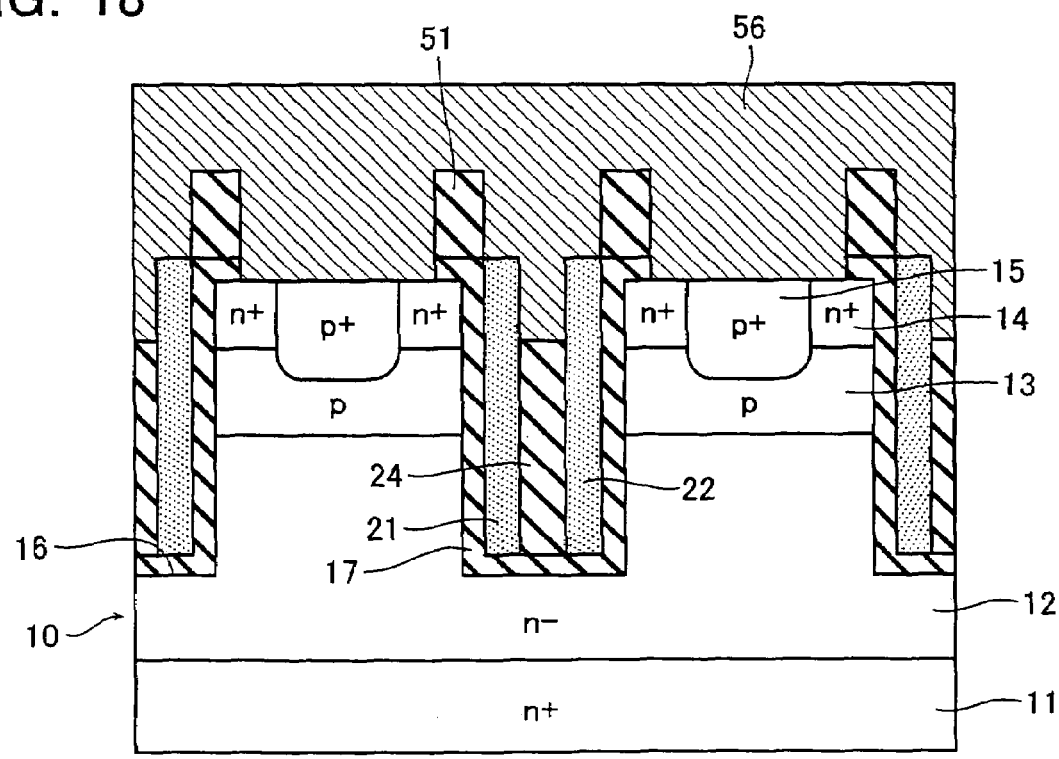
FIG. 18 is a cross-sectional view showing the MOSFET of FIG. 15 in order of process step.
Figure 19:
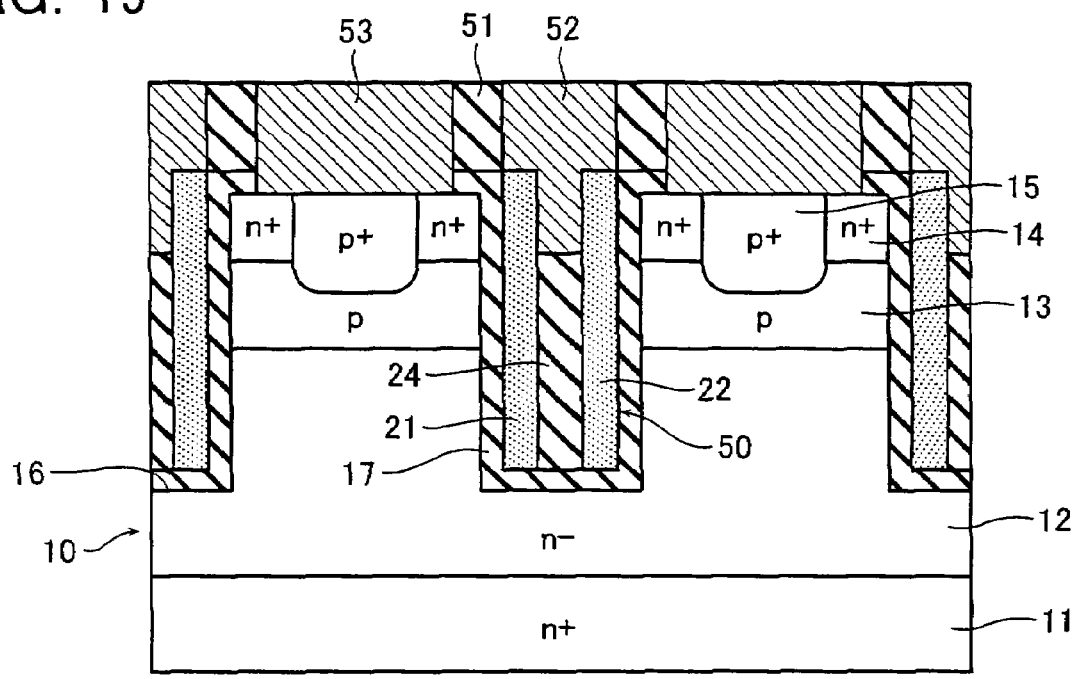
FIG. 19 is a cross-sectional view showing the MOSFET of FIG. 15 in order of process step.
Figure 20:
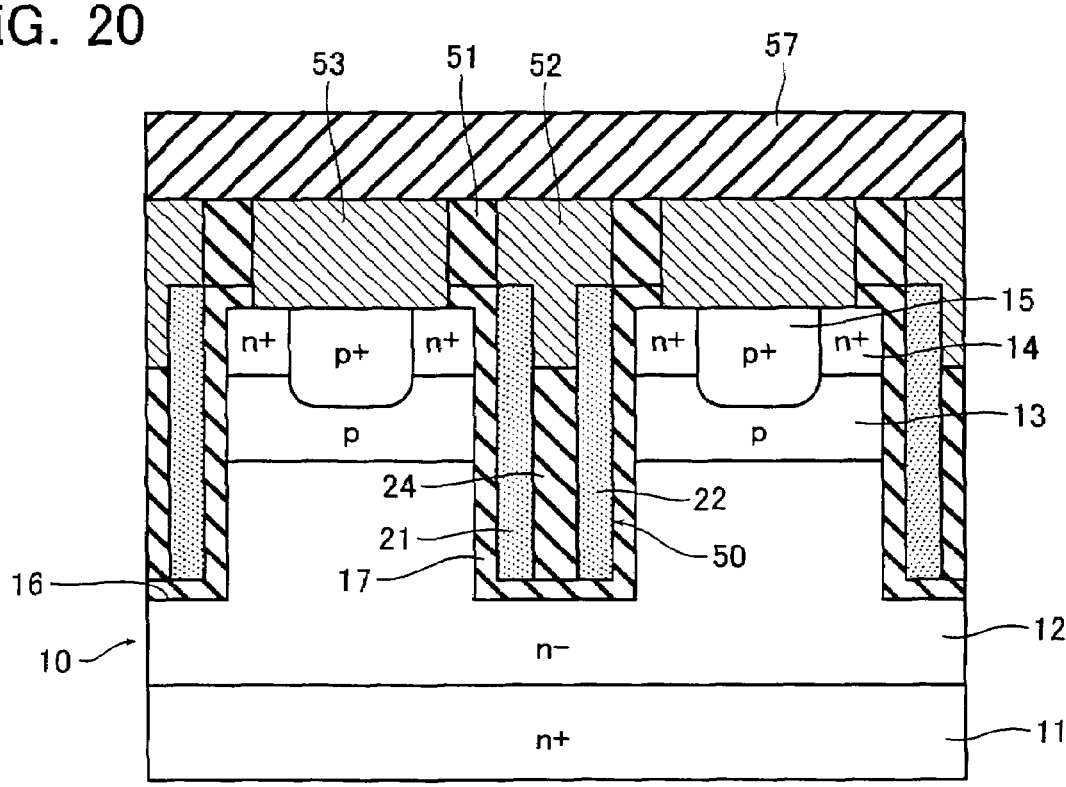
FIG. 20 is a cross-sectional view showing the MOSFET of FIG. 15 in order of process step.
Figure 21:
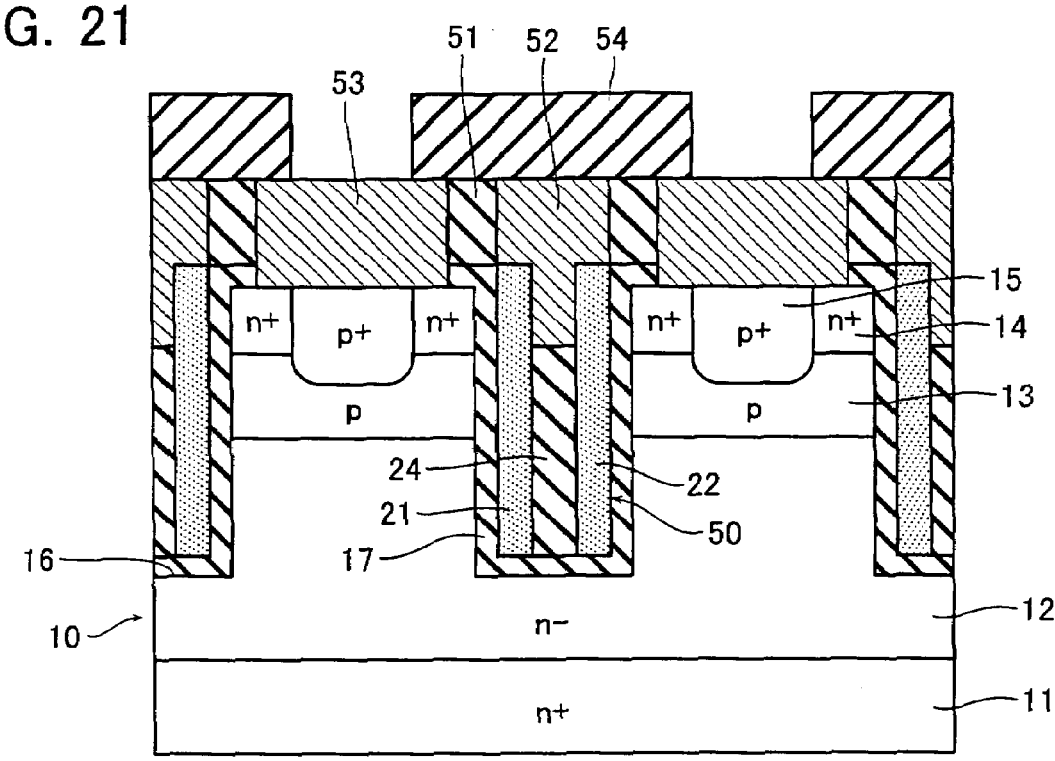
FIG. 21 is a cross-sectional view showing the MOSFET of FIG. 15 in order of process step.
Figure 22:
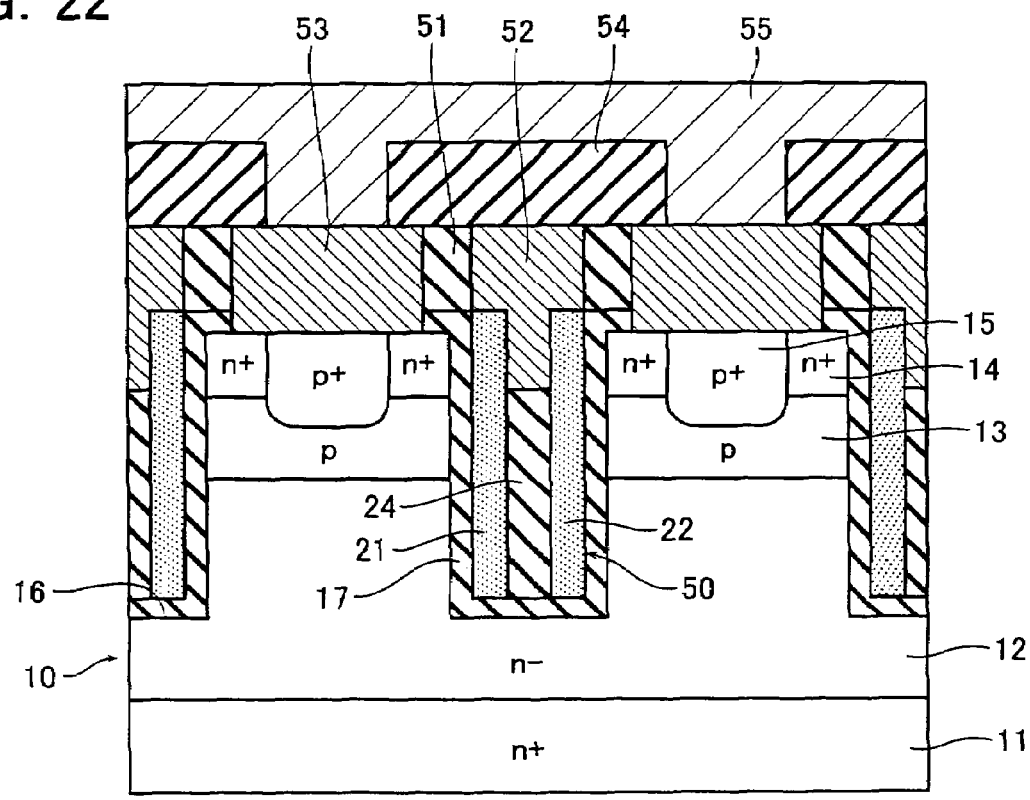
FIG. 22 is a cross-sectional view showing the MOSFET of FIG. 15 in order of process step.

A metal layer 56 is formed on the metal isolation layer 51 next as shown in FIG. 18. Then, a process of etch back or CMP is applied to remove an upper portion of the metal layer 56 to expose the upper surface of the metal isolation layer 51 as shown in FIG. 19. Subsequently, an oxide film 57 is coated over the entire surface as shown in FIG. 20. Then, a contact hole is opened above the source contact metal layer 53 to form the interlayer insulator 54 as shown in FIG. 21. Further, the source electrode 55 is formed to cover the interlayer insulator 54 as shown in FIG. 22. Finally, the drain electrode 27 is formed on the lower surface of the n⁺-type substrate 11 to complete the MOSFET of this embodiment as shown in FIG. 15.

Fourth Embodiment

Figure 23:
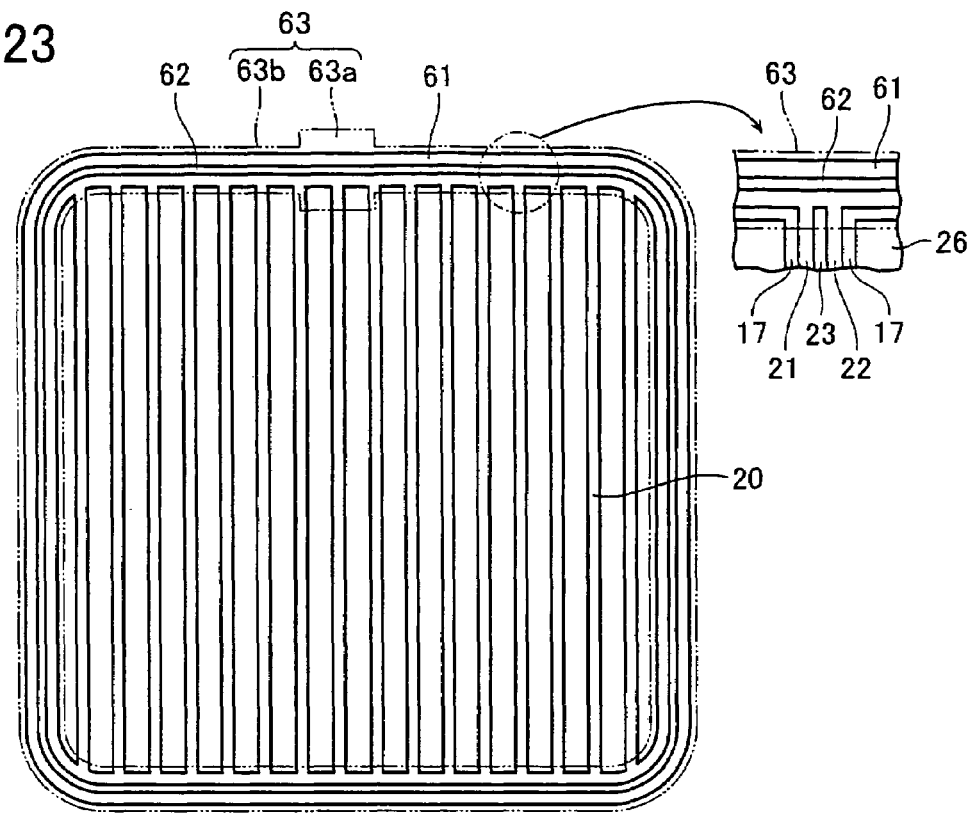
FIG. 23 is a plan view of a MOSFET according to a fourth embodiment of the present invention.

FIG. 23 is a plan view of a MOSFET according to a fourth embodiment, which is seen along A'-A line in the direction of the arrow in FIG. 1.

The gate electrode 20 extends in a direction perpendicular to the page of FIG. 1 and, in a plane, plural such gate electrodes 20 are arranged in parallel at a substantially constant interval in a direction perpendicular to the length thereof as shown in FIG. 23. These gate electrodes 20 are connected only at both ends to an outer annular polysilicon layer 61. As shown in a partial enlarged portion of FIG. 23, the gate metal layer 23 in the gate electrode 20 may be formed within a range of extension of the gate electrode 20. Alternatively, it may be formed continuously to the outer circumference instead of the outer annular polysilicon layer 61 or together with the outer annular polysilicon layer 61.

At least part of the outer annular polysilicon layer 61 is connected via a contact hole 62 to a gate electrode pad 63 formed on the upper surface. The gate electrode pad 63 may be patterned in such a shape that a connection wire 63b is led out from a rectangular pad 63a to the whole outer circumference as shown in FIG. 23. In particular, the gate metal layer in the lower layer may be formed extending to the outer circumference. In this case, only the pad 63a may be formed as the gate electrode pad 63 and patterned such that it is connected to the lower layer via the contact hole formed corresponding to the location for formation of the pad 63a. The source electrode 26, not shown in FIG. 23, is formed in the same plane as the gate electrode pad 63 and separated from the gate electrode pad 63.

Figure 24:
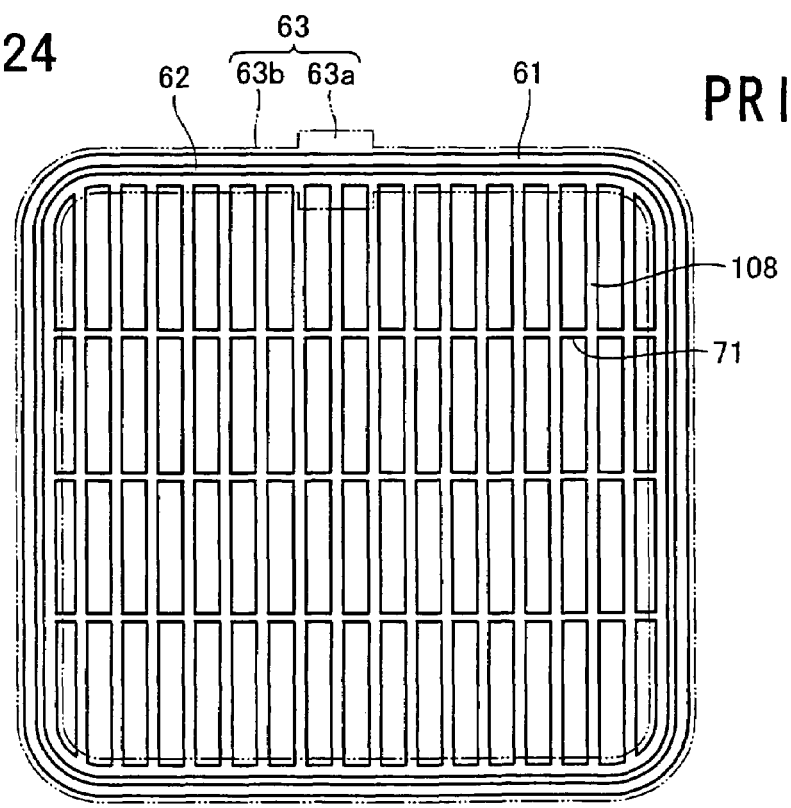
FIG. 24 is a plan view of a MOSFET having fingers of the prior art.

In this embodiment, between sides of the upper portions of the polysilicon layers 21, 22 contained in the gate electrode 20, the gate metal layer 23 is buried fully along the length of the gate electrode 20 to greatly reduce the gate resistance of the gate electrode 20. As a result, the gate electrodes 20 can be commonly connected only at both ends thereof. Therefore, even in a chip of 1 cm square or more, several locations of a gate electrode 108 can be coupled via fingers 71, as the prior art shown in FIG. 24, to eliminate the need for reduction in gate resistance and increase the element arrangement efficiency.

Fifth Embodiment

Figure 25:
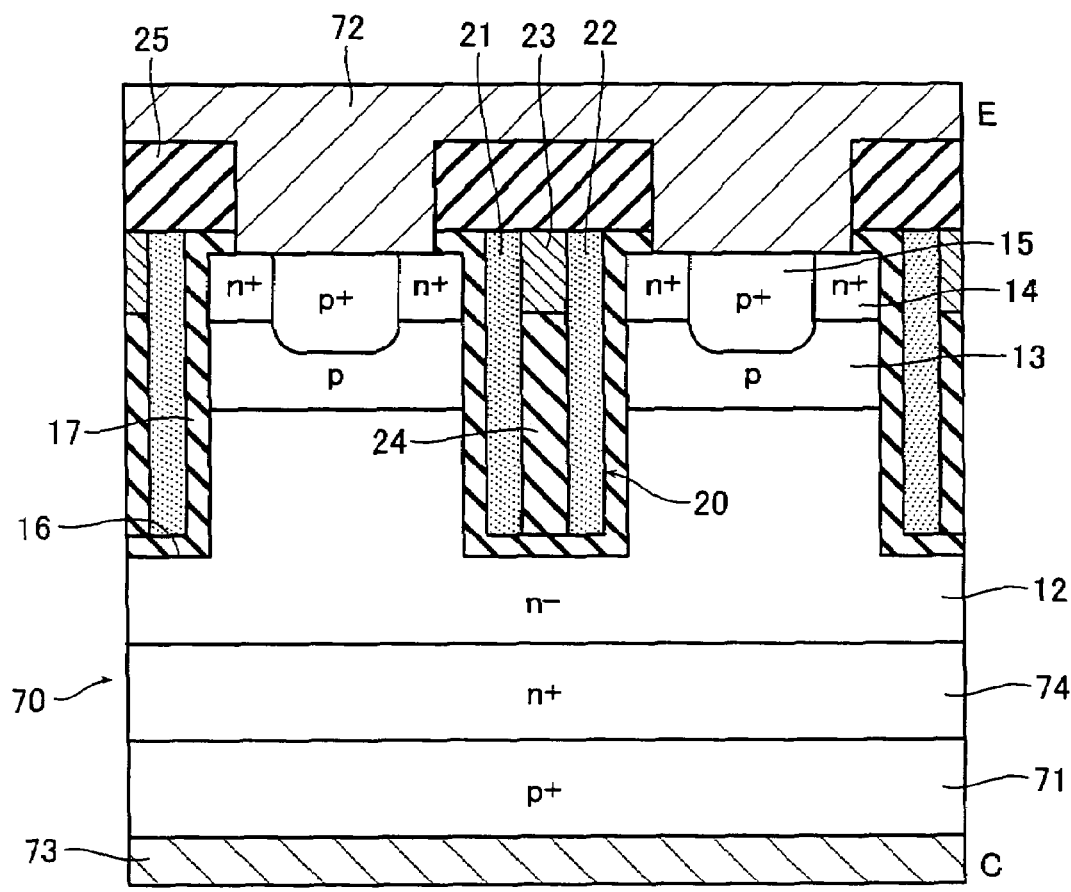
FIG. 25 is a cross-sectional view of an IGBT according to a fifth embodiment of the present invention.

FIG. 25 is a cross-sectional view of an IGBT according to a fifth embodiment of the present invention.

The examples of the present invention applied to the MOSFET have been described hitherto while an example applied to the IGBT will be shown in this embodiment.

A semiconductor substrate 70 is provided to form an n⁺-type buffer layer 74 and a p⁺-type collector layer 71 below the n⁻-type epitaxial layer 12. An emitter electrode 72 is brought into contact with the n⁺-type emitter layer 14 and the p⁺-type back gate layer 15. A collector electrode 73 is formed below the p⁺-type collector layer 71.

Thus, application of the present invention to the IGBT further enhances the effect on reduction in switching loss.

The present invention is not limited to the above-described embodiments. For example, the order of formation of the semiconductor layers contained in the semiconductor substrate is not limited to the above-described order. The order of formation is not asked if the required semiconductor layers can be formed eventually.

What is claimed is:

1. A semiconductor device having a trench gate, comprising:
    a semiconductor substrate having a gate trench formed therein;
    a gate insulator formed along sides and the bottom of said gate trench in said semiconductor substrate; and
    a gate electrode formed on said gate insulator in said gate trench, said gate electrode including a pair of polysilicon layers formed along sides of said gate trench, with a gate metal layer buried in between sides of upper portions of said pair of said polysilicon layers and extending along said gate trench an intermediate insulator buried in between portions of said pair of said polysilicon layers except said upper portions;

a source contact metal layer connected to a contact surface of the semiconductor substrate, said source contact metal layer having an upper surface coplanar with that of the gate metal layer;

a metal isolation layer formed to isolate said gate metal layer from said source contact metal layer and having an upper surface formed coplanar with upper surfaces of both said metal layers;

an interlayer insulator covering an upper end of said gate electrode; and a first main electrode covering said interlayer insulator and connected to said source contact metal layer.

2. The semiconductor device of claim 1, wherein said semiconductor substrate includes a first semiconductor layer of a first conduction type, a second semiconductor layer of a second conduction type formed over said first semiconductor layer, a third semiconductor layer of said first conduction type formed on said second semiconductor layer, and a fourth semiconductor layer of said second conduction type being selectively formed on said second semiconductor layer.

3. The semiconductor device of claim 2, wherein a contact trench is formed in said semiconductor substrate to extend from an upper surface of said third semiconductor layer to said second semiconductor layer; and said fourth semiconductor layer is formed on the bottom of said contact trench.

4. The semiconductor device of claim 2, further comprising a second main electrode formed on a surface of said first semiconductor layer opposite to said second semiconductor layer.

5. The semiconductor device of claim 2, wherein said semiconductor substrate further comprises a fifth semiconductor layer of said second conduction type formed on a surface of said first semiconductor layer opposite to said second semiconductor layer, and said semiconductor device further comprises a second main electrode formed on a surface of said fifth semiconductor layer opposite to said first semiconductor layer.

6. The semiconductor device of claim 1, wherein said gate electrode is one of a plurality of such gate electrodes extending in a particular direction along a substrate surface of said semiconductor substrate and arranged substantially in parallel and commonly connected only at both ends.

7. The semiconductor device according to claim 1, wherein said gate metal layer is higher in conductivity than said pair of said polysilicon layers.

8. A semiconductor device having a trench gate, comprising:

a semiconductor substrate having a gate trench formed therein;

a gate insulator formed along sides and the bottom of said gate trench in said semiconductor substrate;

a gate electrode formed on said gate insulator in said gate trench, said gate electrode including a pair of polysilicon layers formed along sides of said gate trench, with a gate metal layer buried in between sides of upper portions of said pair of said polysilicon layers and extending along said gate trench;

an intermediate insulator buried in between portions of said pair of said polysilicon layers except said upper portions, and wherein said semiconductor substrate includes a first semiconductor layer of a first conduction type, a second semiconductor layer of a second conduction type formed over said first semiconductor layer, a third semiconductor layer of said first conduction type formed on said second semiconductor layer, and a fourth semiconductor layer of said second conduction type being selectively formed on said second semiconductor layer and forming a contact surface together with an upper surface of said third semiconductor layer;

a source contact metal layer connected to said contact surface, said source contact metal having an upper surface coplanar with that of the gate metal layer;

a metal isolation layer formed to isolate said gate metal layer from said source contact metal layer and having an upper surface formed coplanar with upper surfaces of both said metal layers;

an interlayer insulator covering an upper end of said gate electrode; and a first main electrode covering said interlayer insulator and connected to said source contact metal layer.

9. The semiconductor device according to claim 8, wherein said gate metal layer is higher in conductivity than said pair of said polysilicon layers.

* * * * *